United States Patent
Kalantari et al.

(10) Patent No.: US 8,922,298 B2
(45) Date of Patent: Dec. 30, 2014

(54) METHOD AND APPARATUS FOR CABLE EMULATION

(75) Inventors: Nader Kalantari, Laguna Niguel, CA (US); Alfredo Moncayo, Camarillo, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 1009 days.

(21) Appl. No.: 12/958,262

(22) Filed: Dec. 1, 2010

(65) Prior Publication Data

US 2011/0227669 A1  Sep. 22, 2011

Related U.S. Application Data

(60) Provisional application No. 61/340,641, filed on Mar. 18, 2010.

(51) Int. Cl.
*H03H 7/06* (2006.01)
*H03H 7/075* (2006.01)
*H03H 7/38* (2006.01)

(52) U.S. Cl.
CPC ............... *H03H 7/075* (2013.01); *H03H 7/06* (2013.01); *H03H 7/383* (2013.01)
USPC .......................................... 333/167; 333/172

(58) Field of Classification Search
CPC ................................. G09B 9/00; H04B 3/40
USPC ................. 333/32, 33, 167–173, 185
See application file for complete search history.

(56) References Cited

U.S. PATENT DOCUMENTS

| | | | |
|---|---|---|---|
| 5,576,756 A | 11/1996 | Baty et al. | |
| 5,738,525 A | 4/1998 | Davies | |
| 6,809,613 B2* | 10/2004 | Djordjevic et al. | 333/167 |
| 7,089,171 B2* | 8/2006 | Gravrok | 703/14 |
| 7,124,388 B2* | 10/2006 | Wang | 716/115 |
| 7,478,029 B1 | 1/2009 | Joffe | |
| 8,154,362 B2* | 4/2012 | Allen | 333/168 |
| 2010/0246413 A1* | 9/2010 | Schley-May et al. | 370/248 |

FOREIGN PATENT DOCUMENTS

GB  2 292 279  2/1996

* cited by examiner

*Primary Examiner* — Dean O Takaoka
*Assistant Examiner* — Alan Wong
(74) *Attorney, Agent, or Firm* — Weide & Miller, Ltd.

(57) ABSTRACT

A cable emulator configured to emulate the electrical transfer function and properties of a length of conductive cable is disclosed for use in transmitter, receiver and transceiver operation without need for long and expensive length of actual cable. The cable emulator includes an input port for connection to a signal source, such as a transmitter and an output port for connection to a receiver or other signal analyzer. The input port connects to an input impedance matching element, which in turn connects to one or more filter stages. The output of the one or more filter stages connects to an output impedance matching element, which then connects to the output port. The one or more filter stage comprises one or more resistors, one or more inductors and one or more capacitors.

16 Claims, 4 Drawing Sheets

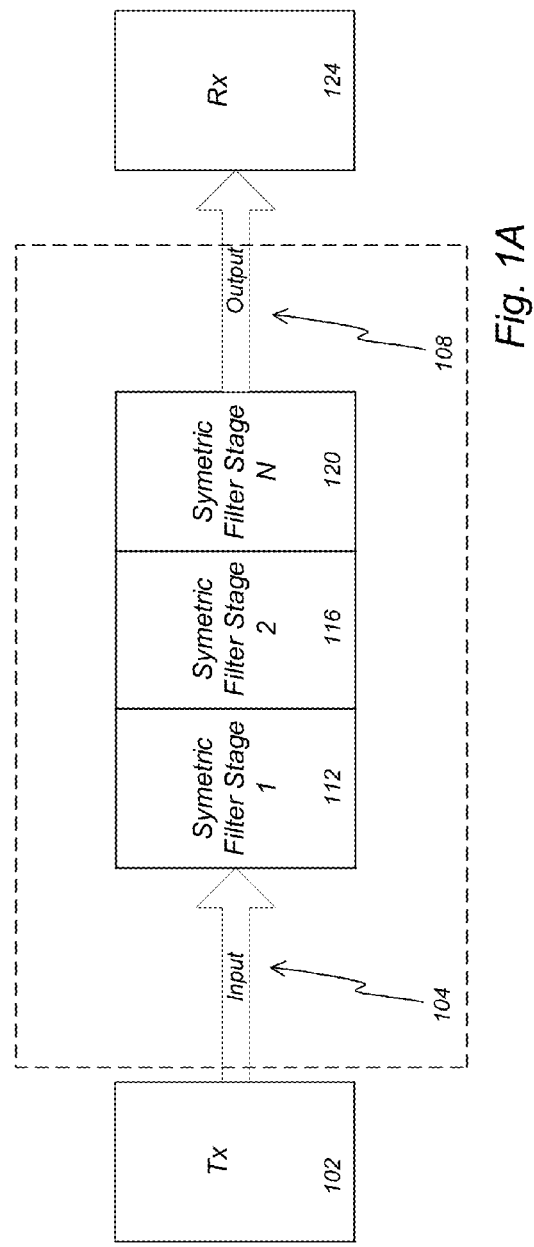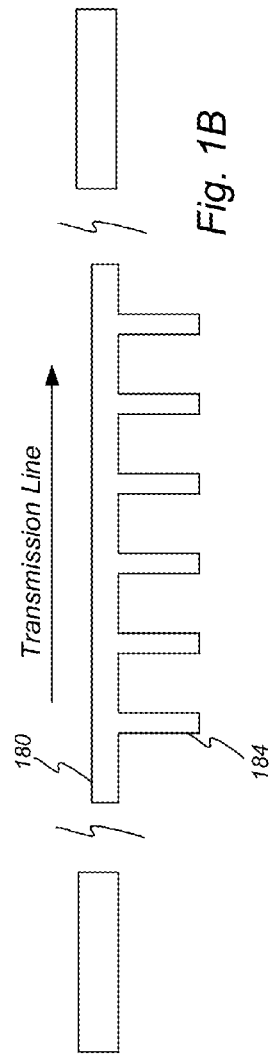

METHOD AND APPARATUS FOR CABLE EMULATION

PRIORITY CLAIM

This application claims priority to and the benefit of U.S. Provisional Application No. 61/340,641 filed on Mar. 18, 2010 entitled Method and Apparatus for Cable Emulation under 35 U.S.C. §119 and/or 120.

FIELD OF THE INVENTION

The invention relates to communication cable emulation and in particular a cable emulator having reduced size and increased frequency range.

RELATED ART

For communication device design and testing, it is essential to operate and test the communication device in an operating environment which is similar to the environment for which the actual product is designed. While environmental tests such as temperature, electrical interference, and power supply characteristics may be tested in the lab, re-creating the communication channel itself has posed problems for engineers. These problems arise because the length of cable to which such communication systems may be attached during actual use may range to hundreds of meters.

One solution is to build elaborate elevated cable racks in a test lab. Then, reels of cables are purchased, moved in the lab, and the cable is physically transferred from the reels to the cable racks. The communication system is then connected to the cable and testing over actual cable may occur. As can be appreciated, the process of constructing the rack and installing the cable is expensive and time consuming in addition to consuming a large amount of space. Likewise, testing at different cable lengths is cumbersome since different cable lengths may have to be installed in the rack.

Another solution that is been proposed is set forth in U.S. Pat. No. 5,576,756 entitled Electrical Networks for Emulating the Response or Co-axial Transmission Cable to Serial Digital Video Signals issued on Nov. 19, 1996. This patent covers a cable emulator system by utilizing one or more components to emulate a cable's transfer function. However, the system of U.S. Pat. No. 5,576,756 suffers from several drawbacks. One such drawback is limited frequency range, often only in the range of 10 to 150 MHz. For modern communication devices, this frequency range is undesirably low and its topology can not be scaled or adjusted to run at frequencies in the gigahertz range. Therefore, there is a need for a cable emulator which has high frequency capability and reduced size as compared to the prior art.

SUMMARY

Disclosed herein is a cable emulator for testing transmitter and receiver performance in view of signal transmission through a cable. Through use of the cable emulator disclosed herein the drawbacks set forth in the background are overcome. In addition, the frequency range for the signals which may be presented to the cable emulator are greatly increased using the method and apparatus disclosed herein. In some embodiments, the frequency range which is capable of being processed through the cable emulator is greater than 1 GHz and in some embodiments, greater than 4.5 GHz.

In one embodiment the cable emulator device comprises an input configured to receive an input signal. The input signal is presented to a first distributed portion comprising a conductor such that the conductor establishes an input impedance and the first distributed portion connects to the input and has an first distributed portion output. A filter connects to the first distributed portion output and has at least a first stage and a filter output. The first stage comprises at least two elements selected from the following group of elements: resistor, a capacitor, and an inductor. A second distributed portion is provided and it has a second distributed portion input connected to the filter output and a second distributed portion output. The second distributed portion comprises a conductor such that the conductor establishes an output impedance.

In one embodiment, the first distributed portion is symmetric with the second distributed portion. In one embodiment, the filter comprises two generally identical resistors, two generally identical capacitors and two generally identical inductors which are arranged in an electrically symmetric layout. The filter may comprise a resistor in parallel with an inductor and the resistor and the inductor may be connected to parallel capacitors. In one embodiment, the device further comprises a second filter connected in series with the first filter. It is contemplated that the second filter may be electrically identical to the first filter. In one embodiment the device further comprising a third filter which is electrically identical to the first and second filters.

Also disclosed herein is a cable emulator configured to electrically emulate a cable comprising an input port configured to receive a signal and an impedance matching element connected to the input port. Also part of the emulator is a filter. The filter comprises at least one resistor in parallel with at least one inductor such that the at least one resistor and the at least one inductor connect to the impedance matching element, and at least one first capacitor connects to the at least one resistor. The at least one second capacitor is connected to the at least one inductor. Also part of this embodiment is an output port connected to the at least one first capacitor and the at least one second capacitor.

In one embodiment, the cable emulator further comprises a second impedance matching network. The cable emulator may further comprise a second filter such that the second filter is generally identical to the first filter and connected between the first filter and the output port. It is contemplated that the cable emulator may further comprise a third filter such that the third filter is generally identical to the first filter and the second filter. In one configuration the impedance matching element comprises a conductor having a length selected to match an impedance of a cable connected to the cable emulator. In one embodiment, the at least one first capacitor and the at least one second capacitor each have a first terminal and a second terminal and the first terminal may connect to ground and the second terminals of the at least one first capacitor and the at least one second capacitor are connected.

A method for emulating a conductive cable is also disclosed. In one embodiment, the method comprises connecting a transmitter to an input port of a cable emulator such that the input port has an impedance matched based on a first distributed element to the transmitter. The method connects a receiver to an output port of the cable emulator such that the output port has an impedance matched based on a second distributed element to the receiver. This method presents an electrical signal from the transmitter to the input port and receives the signal through the distributed element at a lumped filter element. The lumped filter element comprises one or more resistors, one or more inductors, and one or more capacitors. This method then attenuates and filters the signal with the lumped filter element to create a second signal. The method then presents the second signal to a second distributed element such that the second distributed element is configured to impedance match the output port to the receiver.

In one embodiment, impedance matching comprises adjusting a length to a width ratio of the first distributed element and the second distributed element. It is contemplated that attenuating and filtering the signal may comprise processing the signal through an inductive and capacitive network. The attenuating and filtering may duplicate a cable's transfer function. This method may further comprise reducing parasitic inductance by maintaining the one or more resistors and the one or more inductors in parallel.

Also disclosed herein is printed circuit board configured as a cable emulator comprising printed circuit board base configured to support one or more elements of the emulator. A first distributed portion comprising a metallic trace having a first end and a second end is also provided. In this embodiment, the first end comprises an input. Also part of this embodiment is a second distributed portion comprising a metallic trace having a first end and a second end. The second end comprises an output. A filter connects to the second end of the first distributed portion and the first end of the second distributed portion. The filter comprising at least two elements selected from a resistor, capacitor and inductor and the two elements are configured in an electrically symmetric configuration to electrically emulate a communication cable.

In one embodiment, the printed circuit board comprises a first metallic layer and a second metallic layer separated by an insulating layer. The printed circuit board may further comprise two or more vias electrically connecting the first metallic layer and a second metallic layer. It is contemplated that the first distributed portion and the second distributed portion are configured having a length to a width ratio selected to perform impedance matching. The capacitor and inductor may comprise microstrip elements.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 1A is a block diagram illustrating an example cable emulation implementation.

FIG. 1B is a diagram illustrating an exemplary simplified distributed filter.

DETAILED DESCRIPTION

Figure 2:
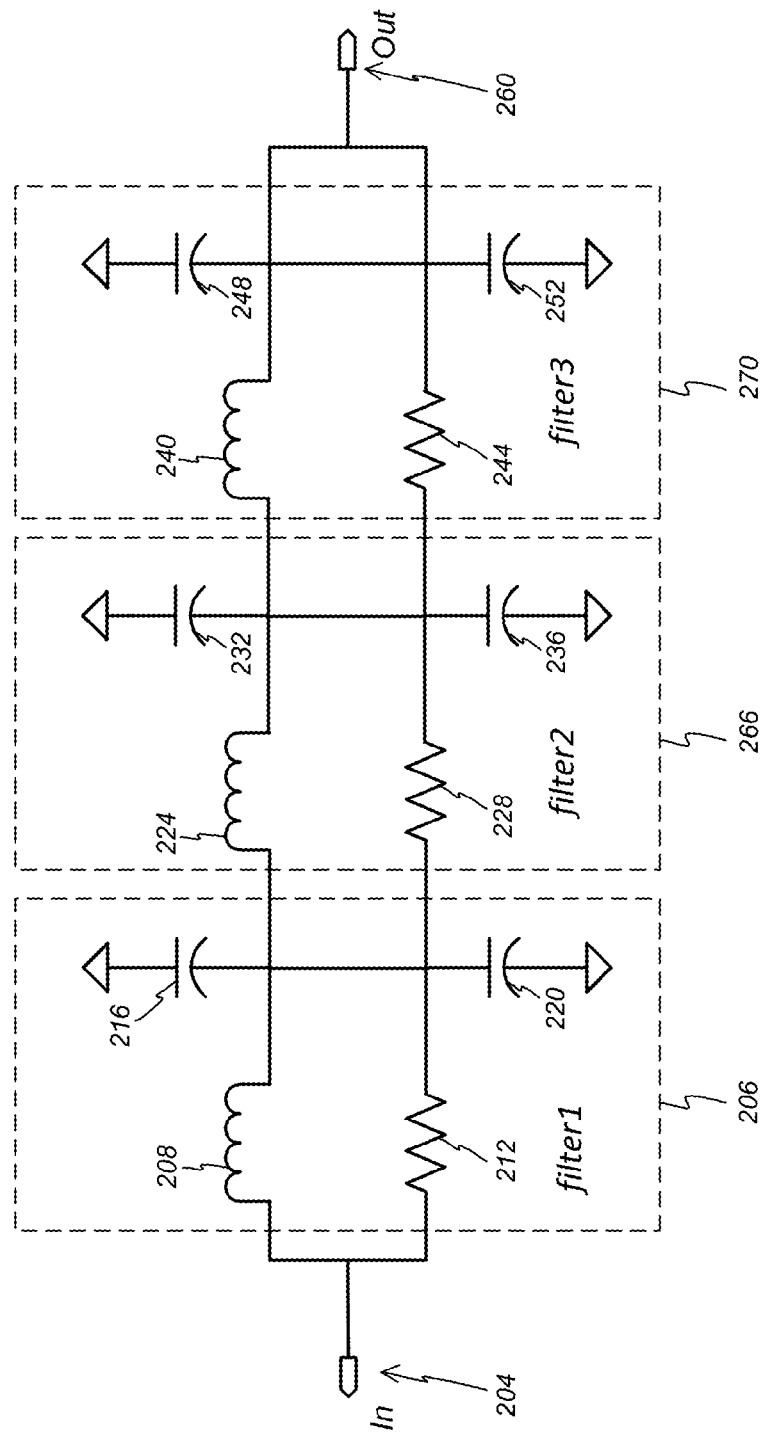
FIG. 2 is a block diagram illustrating a circuit diagram of an exemplary cable emulation implementation.

To overcome the drawbacks of the prior art, a novel cable cloning system is disclosed. To achieve operation at higher frequencies than the prior art the system disclosed herein focuses on novel selection of topology, physical size, and physical design of such using microwave design principles. With regard to size, physical size and dimensions of the system are minimized, in connection with minimized devices which form the system, to enable cable emulation for high frequency signals. Such size minimization is counter to the prior art and traditional cable emulation because it is counter intuitive to accurately emulate a long cable length (hundreds of meters) by minimizing the size of the emulating device. It is more intuitive to obtain a more accurate emulation by using a larger device or cable portions which is more similar in size to the cable being emulated. As discussed below in greater detail, symmetry reduces parasitic inductance and increases the operational frequency range. The operational frequency range for the cable emulator disclosed herein is up to three Gb/s. For example, in one tested configuration the performance was achieved up to 4.5 GHz, which is three times the Nyquist rate of three Gb/s or for data with transitions as fast at 75 ps (fmax ~0.35/tr-4.5 GHz) where the term ps represents picoseconds and the term tr represents rise time.

FIG. 1A illustrates a block diagram of an example embodiment. In this embodiment an input 104 receives a signal from a transmitter 102. The transmitter may comprise any type transmitter which may transmit a signal over a channel and which is undergoing testing or other analysis with the cable emulator. The input 104 connects to a first symmetric filter stage 112. In this embodiment the first symmetric filter stage is configured in a symmetric nature.

The first symmetric filter stage 112 may connect to one or more addition filter stages 116 through stage N 120, where N can be any number. It is contemplated that having fewer stages provides the benefit of higher frequency capability while a greater number of stages increases the accuracy of the cable model. The components which make up the filters 112, 116, 120 may comprise any type device, whether active or passive which are configured to emulate the transfer function and behavior of a transmission line. In other embodiments distributed filters may be utilized. There are many types of filter implementations. The most common are discrete RLC, but it is possible to use distributed reactive loads implemented as a cascaded network (much like the embodiment of FIG. 1), where the reactive elements may be implemented as discrete RLC elements or transmission line "stubs" with termination made up of any of: short, open, or some other impedance between that of a short and an open. An exemplary distributed filter is illustrated in FIG. 1B. As shown, the distributed filter comprises a transmission line 180 and one or more stubs 184. The stubs 184, which may comprise reactive elements, extend from the transmission line 180 as shown. This configuration may be implemented as a microstrip form.

The output of the final filter stage 120 is presented on an output 108 to a receiver 124. Either the transmitter 102 or the receiver 124 may comprise test equipment or the communication equipment under analysis.

It is also contemplated that in addition to the filter stage shown in FIG. 1, one or more distributed signal channels 104 & 108 may be provided between the input and the filter(s) and the output and the filter(s). These distributed signal channels emulate the transmission line impedance and therefore are configured to match impedance. In this example embodiment the exact length or width of the channels 104, 108 can be varied, but the width per unit length matters is of importance because it will determine the impedance. For example, element 316 in FIG. 4 comprises a side shielded microstrip having the desired characteristic impedance (Zo) to match 304 or 330 at the output side Impedance matching using these distributed signal channels is known in the art and as such is not described in detail herein FIG. 2 illustrates an example circuit diagram of a cable emulation implementation. This is one possible example embodiment and as such it is contemplated that other embodiments may be enabled after reviewing this disclosure. In this example circuit implementation, an input 204 connects to a first stage 206, an inductor 208, and a resistor 212 which are in parallel. The opposing terminal of the inductor 208 connects to a capacitor 216, which has an opposing terminal that is connected to ground as shown. Likewise, the opposing terminal of the resistor 212 connects to a capacitor 220 which has an opposing terminal that is connected to ground. As shown, the opposite terminals of the capacitors are also connected. These symmetric parallel capacitors 216, 220 reduces the undesirable series inductance of a surface mount device (SMD) component, which in turn results in better performance at high frequencies due to the effective capacitor having an increased self-resonant frequency. The improvement in bandwidth depends on the specific choice of component values. The increased self-resonant frequency improves the network bandwidth and hence performance. The self-resonant frequency of a capacitor is that frequency at which it changes from behaving like a capacitor with decreasing impedance vs. frequency, to behaving like an inductor with increasing impedance vs. frequency. This varies with capacitor. Thus it is preferred to reduce parasitic inductance as much as possible. It is contemplated that each of the capacitors 216, 220, and the others, may actually be multiple capacitors of smaller value such that the aggregate Ctotal is the proper value while decreasing parasitic inductance by "n", where n is the number of capacitors in a given filter stage.

Collectively, these elements are referred to as first stage elements. In this example embodiment, elements 208 and 212 are in parallel with the opposing sides of their terminals connected as shown. Likewise, elements 216 and 220 are in parallel and connected to ground at one terminal and from the other terminal connected to elements 208 and 212. This connection arrangement is present in the other stages as shown in FIG. 2. In one configuration the clone exhibits generally symmetric response if the input and the output are swapped or reversed. As shown in FIG. 2, the network is a classical "L" type network. It is possible to represent the network as a "T" or "pi" network in which case another set of capacitors would be placed at the input port 204, before the initial resistor and inductor.

In this embodiment, the second stage 266 is generally similar to the first stage with an inductor 224 connecting to the inductor 208 and capacitor 216 as shown while a resistor 228 connects to the resistor 212 and capacitor 220. The output of the inductor 224 and resistor 228 connects to capacitors 232, 236 as shown. The opposing terminals of the capacitors 232, 236 connect to ground. Collectively these elements are referred to as second stage elements. These stages may be referred to as generally symmetric where the symmetry for this filter is defined in the horizontal plane, that is, from a physical design point of view mirroring top to bottom in FIG. 2. The resistor and inductor are in parallel and as such establish symmetry. Stated another way, these elements may be electrically symmetric. It is however also possible to have a symmetric filter mirrored along the vertical axis, from "in" to "out". Generally, "T" and "pi" networks are symmetric in this way. T and pi networks are understood by one of ordinary skill in the art and hence not discussed in detail herein.

In this embodiment, the third stage 270 is generally similar to the first stage with an inductor 240 connecting to the inductor 224 and capacitor 232 as shown while a resistor 244 connects to the resistor 228 and capacitor 236. The output of the inductor 240 and resistor 244 connects to capacitors 248, 252 as shown. The opposing terminals of the capacitors 248, 252 connect to ground. Collectively these elements are referred to as third stage elements. An output connects to the third stage as shown.

The values of these elements 208-252 are selected to represent and duplicate a cable's transfer function to thereby provide a clone or emulation of an actual cable to a signal presented at the input 204. In one embodiment the inductance values are selected to match the input and output of the emulator for low frequency. In general, the RLC filter 206, 266, 270 provides the desired attenuation and behavior to mimic the cable. In one example embodiment for a 60 meter clone the following element values are utilized: L1=300 nH, L2=75 nH, L3=18 nH, R1=100, R2=25, R3=6, C1=1.8 pF, and C2=C3=0.39 pF. For an exemplary 200 m clone: L1=2.2 uH, L2=L1/4, L3=L1/16, R1=100, R2=25, R3=6, C1=18 pF, and C2=C3=5.6 pF. These values are provided for the purposes of understanding and discuss and the claims that follow are in no way limited to the these specific values, In operation, a signal presented at the input 204 encounters the elements of the first stage 206, second stage 266, and third stage 270. The inductors emulate the inductance of a cable. The combination of RLC creates a lumped filter that emulates the characteristic of the cable precisely. In various different embodiments both simulation and measurement can occur to determine component values. Based on testing, the results from modeling, implementation, and testing of actual cables are in close agreement. Cable loss behavior is well modeled in modern circuit simulation tools. In one embodiment a cable model representation is run with an optimization algorithm in a circuit network simulator.

As can be seen from FIG. 2, the elements are in parallel with an upper circuit branch and a lower circuit branch. Symmetry is maintained between the upper and lower branches. By placing the elements in parallel, the parasitic inductance and capacitance is reduced. For example, the self resonate frequency (SRF)=$1/\sqrt{(LC)}$ so when L is reduced, SRF is increased. By using only the two symmetric C elements, the effective parasitic inductance, L, is reduced by half. This would in turn increase the relative SRF by 1/sqrt(0.5), or about 40%.

Therefore, the parallel capacitors are used to intentionally reduce or eliminate the effective series inductance (ESL). This has the effect of extending or pushing the notches due to ESL and the capacitors by about the 40% as cited above, i.e. where $\omega=1/\sqrt{LC}$, so the resulting improvement is $=1/\sqrt{0.5}=1.41$ thereby making the clone more accurate for high frequencies.

This will increase the BW and improve the return loss. This in turn makes the emulator more accurate for high frequencies because the notch due to SRF is pushed out. This increases bandwidth can be explained by the increase in SRF. The combination of the inductor (L) and the capacitor (C) form the basis of the filter. If the capacitor (C) begins to look or behave like an inductor (L), then the filter no longer functions as desired or designed. In terms of return loss, along a distributed network or transmission line, when a shunt impedance which is different than the characteristic or effective impedance of the network is present, it causes signal energy to be dissipated or reflected back to the input. This results in decreased signal energy delivered to the output and hence no longer an optimal filter.

Figure 3:
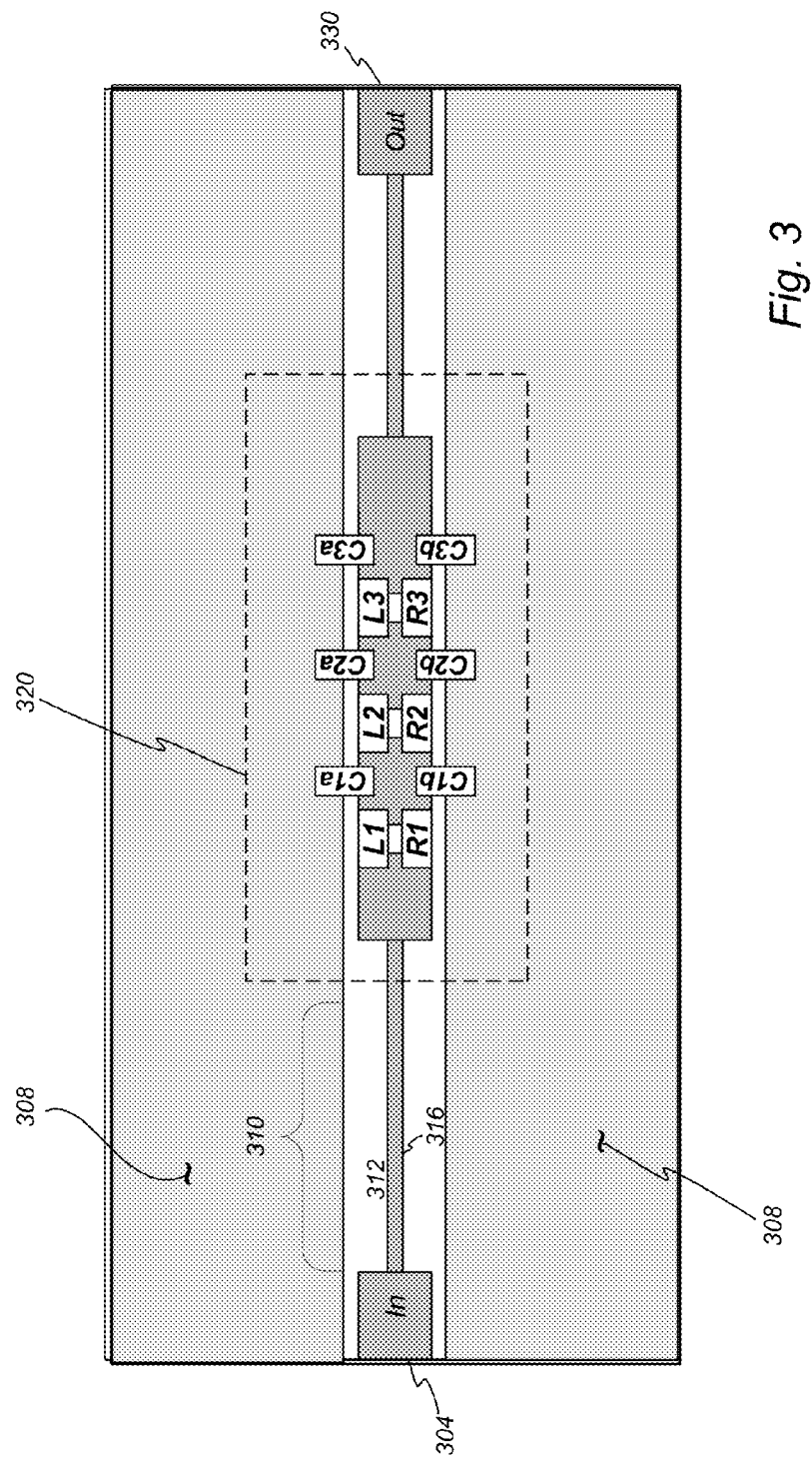
FIG. 3 is a top view of an exemplary circuit network physical layout of a cable emulation implementation.

FIG. 3 illustrates top view of an exemplary integrated circuit of a cable emulator implementation. This is one possible physical implementation and as such other embodiments and implementations may be arrived at after reviewing the disclosure that follows. In this example embodiment, a support structure 308 houses the cable emulator architecture. The support structure may comprise any type physical support structure including one or more layers of an integrated circuit or printed circuit board (PCB). In this embodiment the area 308 comprises a metallic top layer. In one embodiment the area 308 comprises a ground plane. Opposing the metallic top layer may be a metallic bottom layer (not shown). In one or more embodiments, there is an insulator (dielectric material such as FR4 in the case of a PCB, or SiO2 in the case of an integrated circuit) between the top and bottom metal layer. An input 304 and an output 330 are provided to present the signal input and output.

As part of or etched into the support structure 308 is a distributed portion 310 and a lumped portion 320. The distributed portion comprises open space 312 and a conductive path 316 or signal path. The open space 312 may remain open or be covered or filled with a solder mask. The conductive path 316 represents the transmission line for purposes of impedance matching. In one embodiment the conductive path 316 may comprise a metallic trace on a printed circuit board. In other embodiments the conductive path 316 may comprise a planar wave guide, wire, or other type path. Note that the prior art implementation, upon examination, revealed circular wire cable as the interconnect mechanism between actual filter elements. For example coaxial cable may be used. This resulted in uncontrolled inductance and hence low bandwidth. At high frequency the cable performs as a low pass filter. On a PCB type structure, a transmission line has uniform, distributed inductance (L) and capacitance (C) per unit length. The added benefit is that a system as described herein exhibits consistent impedance and electrical characteristics and are thus largely unaffected by typical environmental conditions.

In one embodiment the distributed portion is set to establish a 50 or 75 ohm matching impedance. In other embodiments other impedance matches may be established.

One benefit of the present implementation is that the dimensions of the conductive path 316 can be changed without affecting the cable characteristics, which are controlled by the lumped portion 320. In one exemplary configuration, changes to the length of the conductive path 316 do not change the impedance, but changes in the width of the conductive path will change the impedance. In one embodiment, the impedance is adjusted to 75 ohms for connection to a 75 ohm transmitter and receiver modules. Also affecting the impedance is the distance of the conductive path to a ground plane. As a result, the cable emulator system may be configured in different manners, such as a part of a connector, IC, or PCB without affecting the emulated cable characteristics. In such various embodiments impedance matching may occur in any manner. Hence, the cable emulator may be built into test equipment, connectors, printed circuit boards, or any other type connector. In one embodiment the emulator system is built into or part of a BNC type connector and because of the emulator system's small size, it may be realized within or as part of the BNC connector. This is in contrast to prior art implementations which have a size of about 3 feet by 1.5 feet with tens of cable extending therefrom. The present design may be implemented in a size of about 1 inch by 2 inches.

Located in the center section is the lumped portion 320, which in this embodiment comprises a filter having one or more stages. These stages are discussed above in connection with FIG. 2 and as such are not discussed again. The inductors L1, L2 and L3 are configured opposite resistors R1, R2 and R3. Connected between these elements are the capacitors C1, C2 and C3 as shown. Surrounding these areas, such as between space 308 and 316, may be open space, a gap, or conductive and insulation layers In one embodiment these elements L1-L3, R1-R3, and C1-C3 are integrated elements or comprise miniature SMD components. Use of these type devices reduce or minimize parasitic elements that create undesirable impedances. The smaller elements have less parasitic elements because smaller length metal dimensions or devices have smaller inductance and thus the SRF is pushed out. For example, a one pico Farad capacitor in SMD may possess a 500 pico Henry inductance. However, at a smaller size, the built in inductance is smaller. With smaller elements the self-resonant frequency is higher than with larger components, therefore, the circuit covers higher frequency range without seeing undesired peak or notch in its transfer function. In one embodiment all of the areas, traces, and devices are minimized.

In this embodiment, three stages are shown but in other embodiments any number of stages could be present. In addition, additional filters may be provided. With less than three stages however challenges may be presented when attempting to configure the filters portions to accurately model the cable.

In one embodiment the filter and/or the impedance matching distributed portion is implemented on a shielded microstrip line transmission line. In one embodiment, the microstrip line is a transmission line geometry with a conductor trace on one side of a dielectric substrate and a single ground plane on the opposite side. It may be configured as an open structure there providing a fabrication benefit or as an enclosed structure reduce or prevent radiation, and electromagnetic interference. Generally, a microstrip is a form of transmission line that is well suited to printed circuit boards. The microstrip or stripline may comprise an outer conductor having two sides and in inner conductor. Stated another way, it may comprise two flat metal plates on either side of a center conductor, or a single flat plates. The width of the strips are one component that sets the characteristic of the impedance of the line. The microstrip may be made out of copper on a printed circuit board (PCB). In general, striplines and microstrips are understood by one of ordinary skill in the art and as such are not described in detail herein.

The microstrip can transport RF or electrical energy from one point to another, and it can also be used as a capacitance or inductance at specific frequencies. Instead of individual capacitor elements and wire inductors, specific lengths of transmission lines using distributed element or lumped element design may be enabled. Since the lengths necessary to implement inductors and capacitors are related to the wavelength of the energy, it is preferred in one embodiment to build such a configuration on a printed circuit board or other substrate as the frequency of the signal presented to the cable emulator is increased, such as but not limited to above 2 GHz. Microstrip lines are generally understood by one of ordinary skill in the art may enable a microstrip configuration after reading the disclosure set forth herein.

By having a system having both a distributed portion 310 and a lumped portion 320 the system has the benefit of flexible solution which is capable of implementation in a variety of different environments. For example, the system may be implemented on a printed circuit board (PCB) or on integrated circuit or chip or a hybrid of both.

As a further benefit of the disclosed system, the same topology may be used across several different cable emulators. Thus, this system does not rely on this exact unique layout or the unique filter elements. As such this disclosure and the and thus the claims that follow are not limited to this particular circuit configuration and topology. Thus, when modeling a 60 meter or 200 meter cable, the same topology could be used with different filter element values to model the length of the line. Between different transmission line lengths, the values of the elements may change. Namely one or more of the resistance, capacitance and inductance would increase or decrease to clone or emulate the desired length of transmission line.

As can be seen, the physical implementation is symmetric. By adding symmetry to the design, undesirable parasitics are reduced. This is the case because at the physically implementation level the parasitics are a limiting factor for high frequency operation. Based on testing the lumped components have built in capacitances and inductances, which are referred to as parasitics. However, the symmetry cancels much of the parasitic effect of the devices because using two C/2 caps in parallel gives you C as the final cap value with half of the ESL (effective series inductance). As such the SRF is pushed out by 41% ($\sqrt{2}=1.41$). By analogy, the inventor also rationalized that cables themselves are generally symmetric and as such to ideally model a cable, such symmetry may be mirrored to achieve high frequency operation.

In this example embodiment the intentional capacitive elements are arranged in parallel. This provides the benefit of reducing the parasitic inductances, which limit high frequency performance. By way of example, a resistance R in parallel with another resistance R results in a total resistance of R/2. Likewise, by establishing the capacitors, inductors and resistors in parallel as is shown, the unwanted parasitics are reduced which in turn achieves operation, i.e. emulation, at higher frequencies.

In addition, each capacitor also has a small built in inductance. This in turn creates a notch at high frequencies. By creating a parallel arrangement, the notch is pushed to a higher frequency thereby extending the high frequency capability. This also eliminates or reduces the self resonance frequency. For example, as the self resonate frequency approximates 1/area then the smaller sized components extend the self resonate frequency, which in turn enable operation at higher frequencies that prior art solutions.

Figure 4:
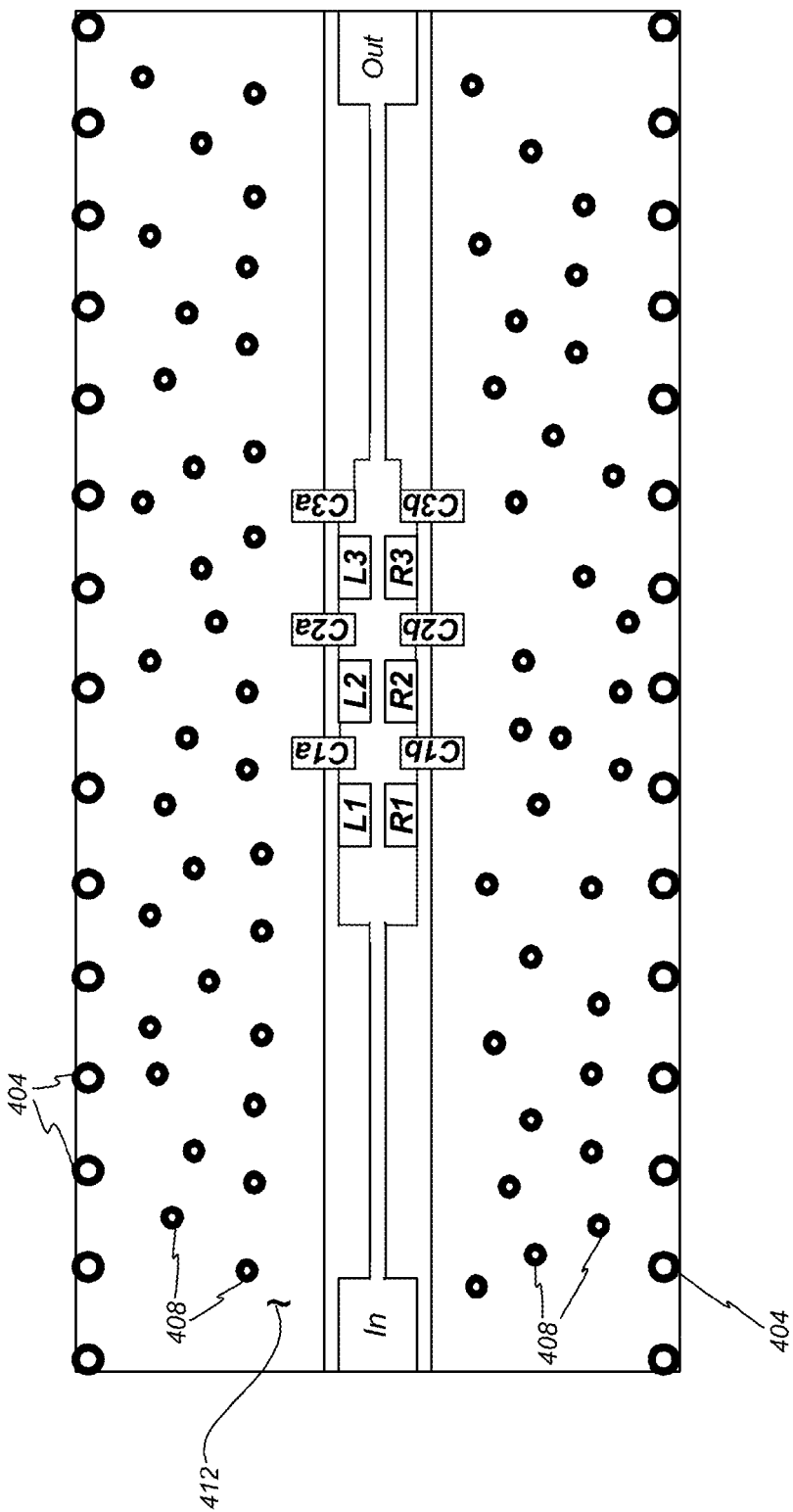
FIG. 4 is a top view of an example embodiment of a cable emulation implementation with vias.

FIG. 4 is a top view of an example embodiment of a cable emulator implementation with vias in a circuit board implementation or planar arrangement. FIG. 4 has elements which are generally similar to the elements of FIG. 3 and as a result only the elements which differ from FIG. 3 are discussed below. In this embodiment an outer set of vias 404 and an inner set of vias 408 are provided. In general, the vias connect the lower or inner conductive layers to an upper conductive layer. Between these layers is a dielectric or insulating layer. These layers may comprise ground planes. Connecting the upper and lower conductive layers 412 establishes these layers at the same voltage potential which in turn eliminates or reduces inductance or capacitance that would be established between these opposing layers 412 if such one or more layers were not at the same potential.

The outer vias 404 are spaced at a fixed distance to reduce or avoid oscillation caused by the board edge. At high frequencies, such as above 5-6 G, it is contemplated that the system behaves with microwave properties. In embodiment the outer vias are established at ¼ wavelength distance of the highest frequency of operation in which for example fmax=MAX (0.35/tr, 5/2*data rate). Because the upper and lower layers may be metallic and the center section a dielectric, a type of wave guide is formed and when presented with energy, such as the input signal, it will resonate. Using vias spaced at a distance dependant on the resonance frequency, such resonance is reduced or the resonance that is established may be designed out of the frequency band of interest. The use of vias also drops inductance and reduces undesirable peaking and notching at the band of interest.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A cable emulator configured to electrically emulate a cable, the emulator comprising:
   an input port configured to receive an signal;
   a first transmission line connected to the input port;
   a filter, the filter comprising:
      at least one resistor in parallel with at least one inductor, the at least one resistor and the at least one inductor connected to the first transmission line; and
      at least one first capacitor connected to the at least one resistor;
      at least one second capacitor connected to the at least one inductor, wherein a physical dimensions of at least one first capacitor is the same as the physical dimensions of at least one second capacitor and the at least one first capacitor is symmetric to the at least one second capacitor about a central axis defined by the first transmission line and a second transmission line;
   the second transmission line connected to the at least one first capacitor and the at least one second capacitor; and
   an output port connected to the second transmission line.

2. The cable emulator of claim 1, further comprising a second filter, the second filter generally identical to the first filter and connected between the first filter and the output port.

3. The cable emulator of claim 2, further comprising a third filter, the third filter generally identical to the first filter and the second filter.

4. The cable emulator of claim 2, wherein the impedance matching element comprises a conductor having a length selected to match an impedance of a cable connected to the cable emulator.

5. The cable emulator of claim 2, wherein the at least one first capacitor and the at least one second capacitor each have a first terminal and a second terminal and the first terminal is connect to ground and the second terminals of the at least one first capacitor and the at least one second capacitor are connected.

6. A method for emulating a conductive cable, the method comprising:
   connecting a transmitter to an input port of a cable emulator, the input port having an impedance matched based on a first distributed element to the transmitter;
   connecting a receiver to an output port of the cable emulator, the output port having an impedance matched based on a second distributed element to the receiver;
   presenting an electrical signal from the transmitter to the input port;
   receiving the signal through the distributed element at a lumped filter element, the lumped filter element comprising one or more resistors, one or more inductors, and one or more capacitors;
   attenuating and filtering the signal with the lumped filter element to create a second signal;
   presenting the second signal to the second distributed element, the second distributed element configured to impedance match the output port to the receiver, wherein impedance matching comprises adjusting a length to a width ratio of the first distributed element and the second distributed element.

7. The method of claim 6, wherein attenuating and filter the signal comprises attenuating the signal with at least one resistor and filter comprises processing the signal through an inductive and capacitive network.

8. The method of claim 6, wherein the attenuating and filtering duplicates a cable's transfer function.

9. The method of claim 6, further comprising reducing parasitic inductance by maintaining the one or more resistor and the one or more inductor in parallel.

10. A printed circuit board configured as a cable emulator comprising:
   printed circuit board base configured to support one or more elements of the emulator, the printed circuit board comprising a first metallic layer and a second metallic layer separated by an insulating layer;
   a first distributed portion, configured as part of the printed circuit board, comprising a metallic trace having a first end and a second end, the first end comprising an input;
   a second distributed portion, configured as part of the printed circuit board, comprising a metallic trace having a first end and a second end, the second end comprising an output; and
   a filter, configured as integrated elements that are part of the printed circuit board, connected to the second end of the first distributed portion and the first end of the second distributed portion, the filter comprising at least two elements selected from a resistor, capacitor and inductor, and the two elements are configured in an electrically symmetric configuration to electrically emulate a communication cable.

11. The printed circuit board of claim 10, further comprising two or more vias electrically connecting the first metallic layer and a second metallic layer.

12. The printed circuit board of claim 10, wherein the first distributed portion and the second distributed portion are configured having a length to a width ratio selected to perform impedance matching.

13. The printed circuit board of claim 10, wherein the capacitor and inductor comprise microstrip elements.

14. A printed circuit board configured as a cable emulator comprising:
   printed circuit board base configured to support one or more elements of the emulator, the printed circuit board comprising a first metallic layer and a second metallic layer separated by an insulating layer;
   a first distributed portion comprising a metallic trace having a first end and a second end, the first end comprising an input;
   a second distributed portion comprising a metallic trace having a first end and a second end, the second end comprising an output; and
   a filter connected to the second end of the first distributed portion and the first end of the second distributed portion, the filter comprising at least two elements selected from a resistor, capacitor and inductor, and the two elements are configured in an electrically symmetric configuration to electrically emulate a communication cable.

15. A printed circuit board configured as a cable emulator comprising:
   printed circuit board base configured to support one or more elements of the emulator;
   a first distributed portion, configured as part of the printed circuit board, comprising a metallic trace having a first end and a second end, the first end comprising an input;
   a second distributed portion, configured as part of the printed circuit board, comprising a metallic trace having a first end and a second end, the second end comprising an output, wherein the first distributed portion and the second distributed portion are configured having a length to a width ratio selected to perform impedance matching; and
   a filter, configured as integrated elements that are part of the printed circuit board, connected to the second end of the first distributed portion and the first end of the second distributed portion, the filter comprising at least two elements selected from a resistor, capacitor and inductor, and the two elements are configured in an electrically symmetric configuration to electrically emulate a communication cable.

16. The printed circuit board of claim 15, wherein the capacitor and inductor comprise microstrip elements.

* * * * *